United States Patent [19]
Schmitt

[11] Patent Number: 6,005,413
[45] Date of Patent: Dec. 21, 1999

[54] 5V TOLERANT PCI I/O BUFFER ON 2.5V TECHNOLOGY

[75] Inventor: Jonathan Schmitt, Bloomington, Minn.

[73] Assignee: LSI Logic Corporation, Milpitas, Calif.

[21] Appl. No.: 08/927,358

[22] Filed: Sep. 9, 1997

[51] Int. Cl.[6] .................... H03K 19/0175; H03K 19/00
[52] U.S. Cl. ................... 326/80; 326/58; 326/86; 326/83; 326/81
[58] Field of Search ................. 326/57, 58, 80, 326/81, 86, 87, 83, 121

[56] References Cited

U.S. PATENT DOCUMENTS

| | | | |
|---|---|---|---|
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,512,844 | 4/1996 | Nakakura et al. | 326/81 |
| 5,537,059 | 7/1996 | Asahina | 326/81 |
| 5,559,464 | 9/1996 | Orii et al. | 327/333 |
| 5,646,550 | 7/1997 | Campbell, Jr. et al. | 326/81 |
| 5,736,869 | 4/1998 | Wei | 326/81 |
| 5,844,425 | 12/1998 | Nguyen et al. | 326/58 |
| 5,864,243 | 1/1999 | Chen et al. | 326/58 |
| 5,880,602 | 3/1999 | Kaminaga et al. | 326/81 |

*Primary Examiner*—Michael Tokar
*Assistant Examiner*—Richard Roseen
*Attorney, Agent, or Firm*—Westerman, Champlin & Kelly, P.A.

[57] ABSTRACT

A tri-state input-output (I/O) buffer which includes a core terminal, a pad terminal and an enable terminal. A pad pull-down transistor and pad pull-up transistor are coupled to the pad terminal and have pull-up and pull-down control terminals, respectively. A pull-down control circuit is coupled between the core terminal and the pull-down control terminal. A pull-up control circuit is coupled between the core terminal and the pull-up control terminal. A feedback circuit is coupled between the pad terminal and the pull-up control terminal for sensing a first voltage on the pad terminal and adjusting a second voltage on the pull-up control terminal based on the sensed first voltage to reduce leakage current through the pull-up transistor when an enable signal received on the enable terminal is an inactive state.

17 Claims, 4 Drawing Sheets

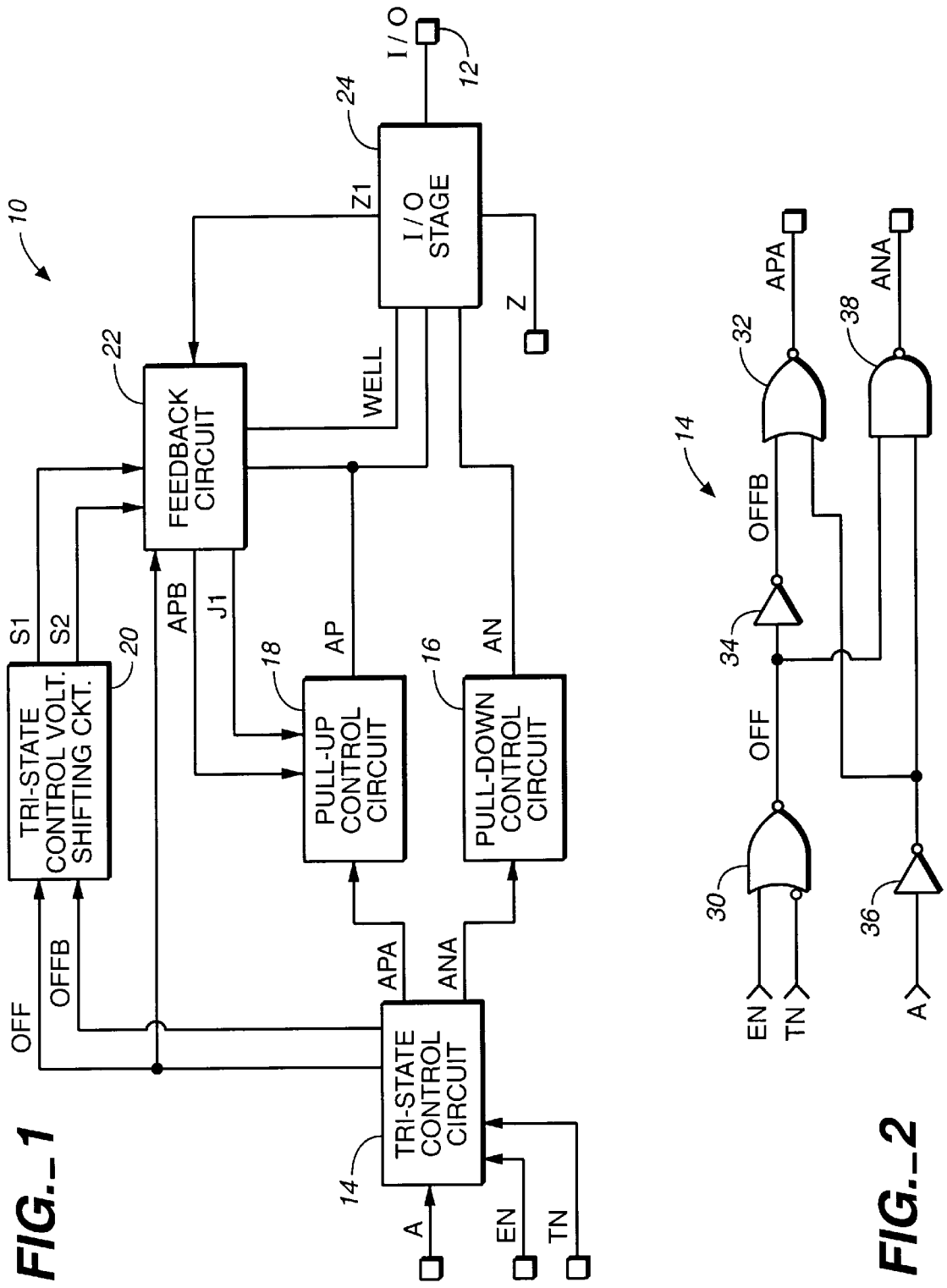
FIG._1
FIG._2

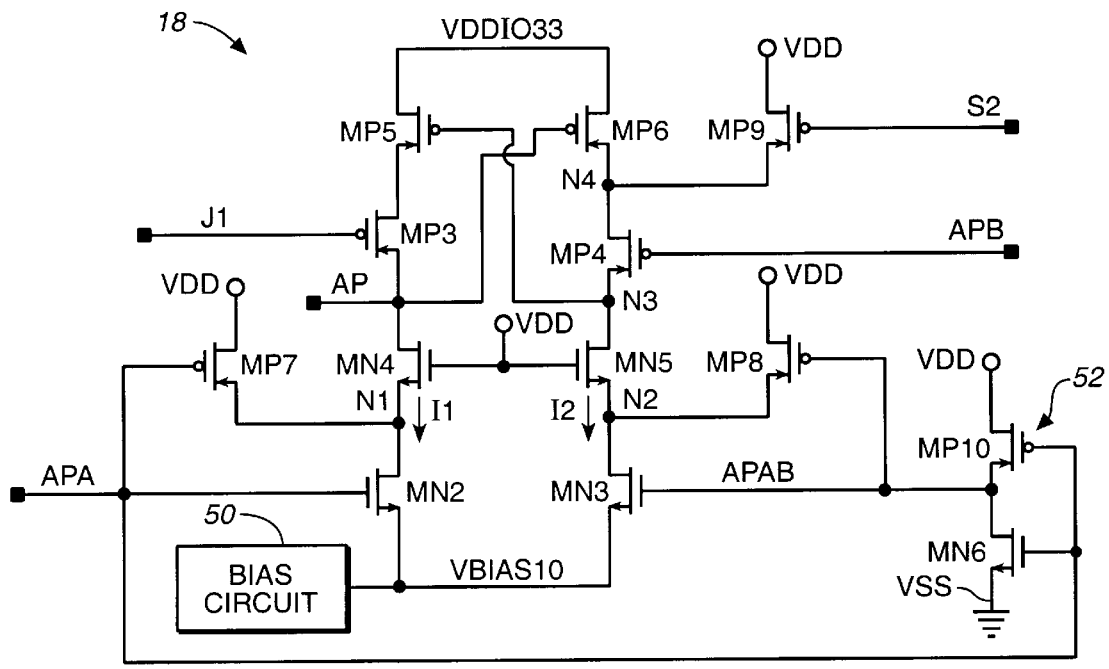
FIG._3A
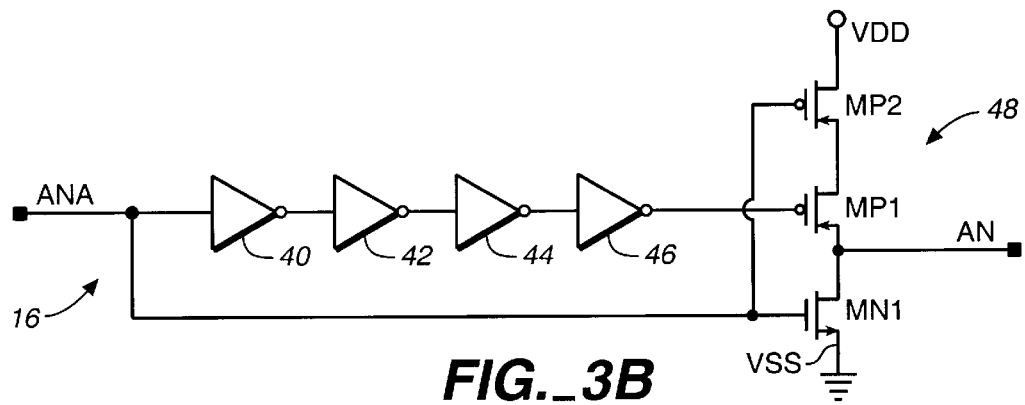
FIG._3B

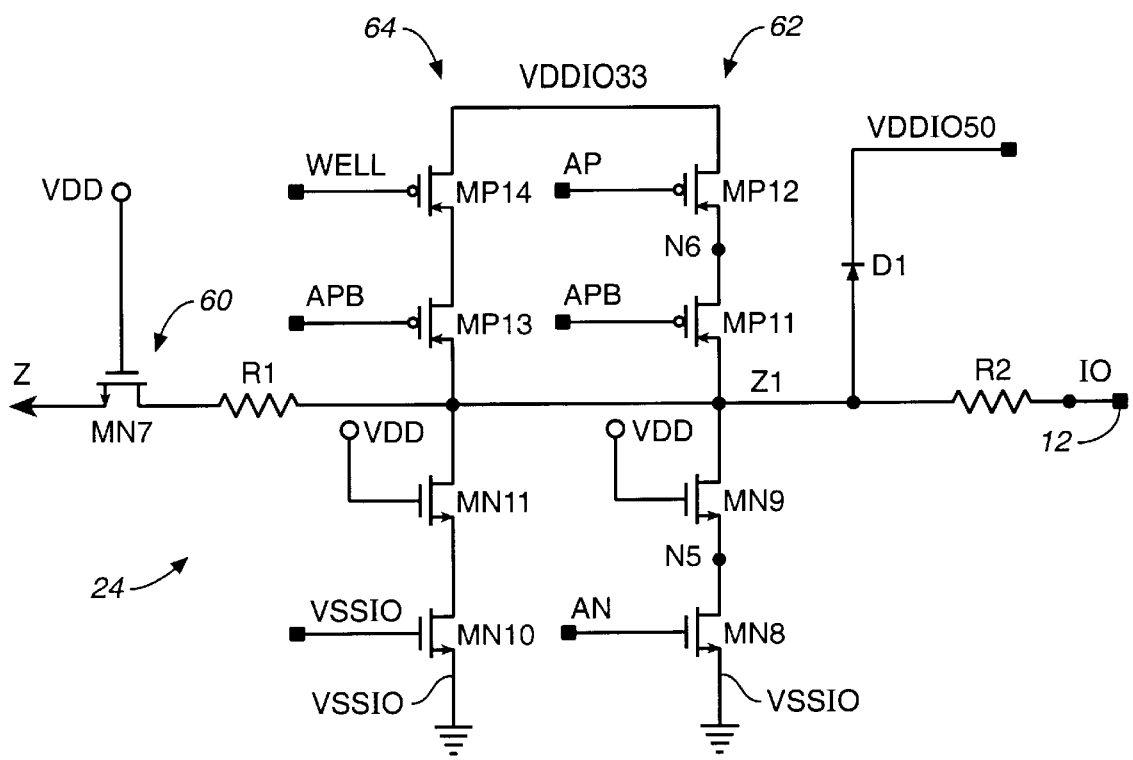
FIG._4
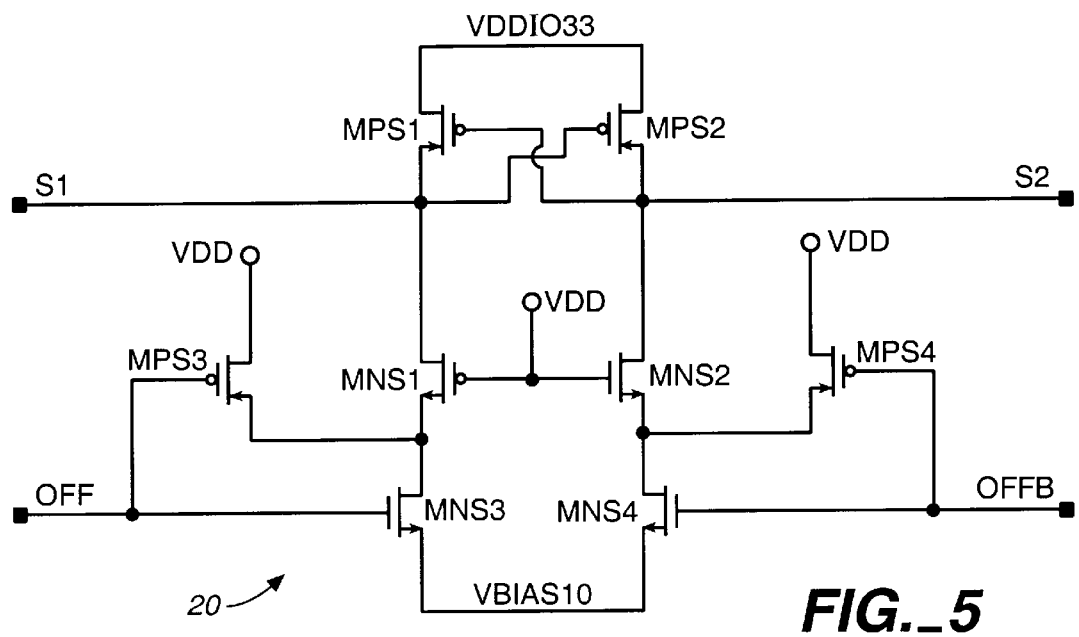
FIG._5

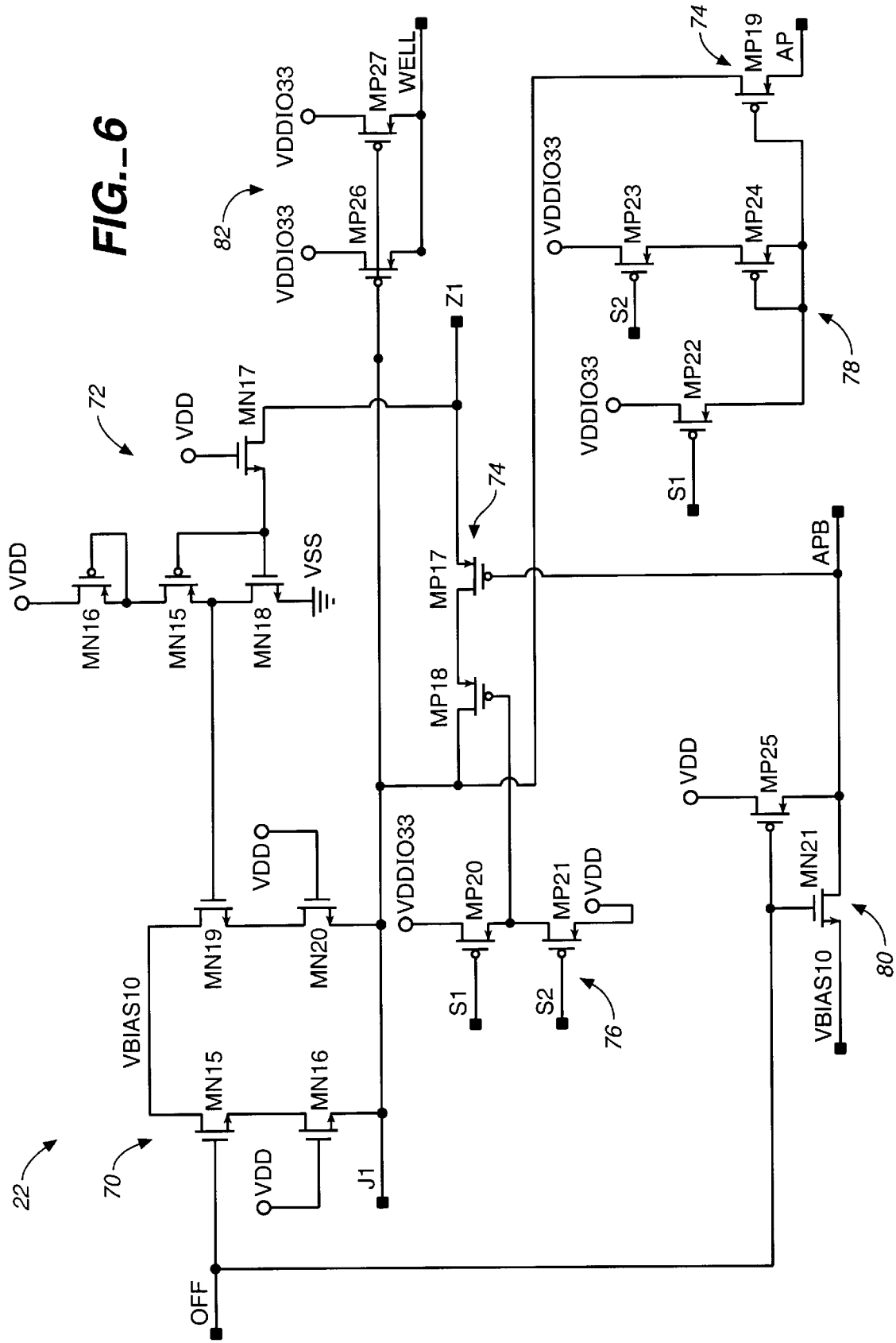
FIG._6

5V TOLERANT PCI I/O BUFFER ON 2.5V TECHNOLOGY

BACKGROUND OF THE INVENTION

The present invention relates to semiconductor integrated circuits and, more particularly, to a 5V tolerant PCI tri-state input-output (I/O) buffer which is fabricated on 2.5 technology and drives a 3.3V output signal without exceeding transistor tolerances.

CMOS integrated circuits are typically provided with tri-state I/O buffers that are selectively operable between a normal drive mode and a tri-state or high impedance mode in which the buffers appear transparent to the output terminals with which they are connected. Advancements in semiconductor fabrication technology enable the geometries of semiconductor devices to be progressively reduced so that more devices can fit on a single integrated circuit. As a result, core voltages of integrated circuits are being reduced to prevent damage to the small devices and to reduce overall power consumption. For example, power supplies are now being reduced from 5V to 3.3V, and from 3.3V to 2.5V.

However, low voltage CMOS devices are often interconnected at a board level to TTL logic and other devices that operate at higher supply voltages of 5V or 3.3V. For example, buffer specifications for peripheral component interfaces (PCIs) require the buffers to be tolerant to input signals having the steady state PCI voltage, such as 5V, and voltage spikes that are twice that of ten percent greater than the PCI voltage, or 11V for a 5V PCI voltage.

Diodes have been placed on the pad terminals of I/O buffers to clamp input spikes at or near the worst case PCI voltage, such as about 5.5V for a 5V PCI. If no further precautions are taken, a clamped 5.5V signal applied to the pad terminal of a 2.5V tri-state output buffer can cause voltage drops across the transistor devices in the buffer that exceed the transistor tolerances, which can cause the gate oxide of the devices to breakdown. It is therefore desirable to provide an I/O buffer that is tolerant to large pad voltages without exceeding the tolerance levels of the devices within the buffer.

SUMMARY OF THE INVENTION

The tri-state input-output (I/O) buffer of the present invention includes a core terminal, a pad terminal and an enable terminal. A pad pull-down transistor and pad pull-up transistor are coupled to the pad terminal and have pull-up and pull-down control terminals, respectively. A pull-down control circuit is coupled between the core terminal and the pull-down control terminal. A pull-up control circuit is coupled between the core terminal and the pull-up control terminal. A feedback circuit is coupled between the pad terminal and the pull-up control terminal for sensing a first voltage on the pad terminal and adjusting a second voltage on the pull-up control terminal based on the sensed first voltage to reduce leakage current through the pull-up transistor when an enable signal received on the enable terminal is an inactive state.

In one embodiment, the feedback circuit includes a pass gate for passing the sensed first voltage from the pad terminal to the pull-up control terminal when the sensed first voltage exceeds a selected threshold level. A pull-up voltage protection transistor is coupled between the pad pull-up transistor and the pad terminal. The pad pull-up transistor and the pull-up voltage protection transistors have substrates which are biased at a selected bias voltage by the feedback circuit when the enable signal is in an active state and when the enable signal is in an inactive state and the sensed first voltage is less than the threshold level. When the sensed first voltage exceeds the threshold level, the feedback circuit floats the substrates to an undetermined voltage such that the substrates can rise with the first voltage.

A voltage protection bias circuit applies a first bias voltage to the control terminal of the pull-up voltage protection transistor when the enable signal is in the active state and applies a second bias voltage, which is greater than the first bias voltage, to the control terminal when the enable signal is in the inactive state.

BRIEF DESCRIPTION OF THE DRAWINGS

FIG. 1 is a simplified block diagram of a tri-state input-output (I/O) buffer according to one embodiment of the present invention.

FIG. 2 is a logic diagram of tri-state control circuit within the I/O buffer shown in FIG. 1.

FIG. 3 is a schematic diagram of a pull-down and a pull-up control circuit within the I/O buffer shown in FIG. 1.

FIG. 4 is a schematic diagram of an I/O stage within the I/O buffer shown in FIG. 1.

FIG. 5 is a schematic diagram of a tri-state control voltage shifting circuit within the I/O buffer shown in FIG. 1.

FIG. 6 is a schematic diagram of a feedback circuit within the I/O buffer shown in FIG. 1.

DETAILED DESCRIPTION OF THE PREFERRED EMBODIMENTS

FIG. 1 is a simplified block diagram of a tri-state input-output (I/O) buffer according to one embodiment of the present invention. I/O buffer 10 forms part of an integrated circuit which has been fabricated with a 2.5V CMOS fabrication process, for example. I/O buffer 10 receives a 0–2.5V data signal from the core of the integrated circuit on data terminal A and, in response, drives a 0–3.3V output signal on I/O pad 12. Also, I/O buffer 10 receives 0–5V data signals on I/O pad 12 and supplies 0–2.5V data signals on data terminal Z. Each transistor in I/O buffer 10 is biased such that the gate-to-source and gate-to-drain voltages are all less than a 3.0V tolerance and the drain-to-source voltages are all less than a 2.75V tolerance to prevent damage to the transistors while driving or receiving signals on I/O pad 12.

I/O buffer 10 includes tri-state control circuit 14, pull-down control circuit 16, pull-up control circuit 18, tri-state control voltage shifting circuit 20, feedback circuit 22 and I/O stage 24. Tri-state control circuit 14 receives a 0V–2.5V data signal on data terminal A and receives enable signals on enable terminals EN and TN. Tri-state control circuit 14 generates a 0V–2.5V pull-down control signal on terminal ANA and a 0V–2.5V pull-up control signal on terminal APA which follow the logic state of the 0V–2.5V data signal applied to data terminal A when the enable signals applied to enable terminals EN and TN are low and high, respectively. When either the enable signal on enable terminal EN is high or the enable signal on enable terminal TN is low, tri-state control circuit 14 drives the pull-down control signal on terminal APA low and the pull-up control signal on terminal ANA high.

Pull-down control circuit 16 receives the 0V–2.5V pull-down control signal on terminal ANA and generates a delayed and inverted 2.5V–0V pull-down control signal on terminal AN. Pull-up control circuit 18 receives the 0V–2.5V pull-up control signal on terminal APA and generates a level-shifted and inverted 3.3V–0.8V pull-up control signal on terminal AP. Pull-up control circuit 18 also selectively floats terminal AP to an undetermined voltage level as a function of control signals received from feedback circuit 22 on control terminals APB and J1.

I/O stage 24 selectively pulls I/O pad 12 high substantially to 3.3V in response to a 0.8V level on pull-up control terminal AP. I/O stage 24 selectively pulls I/O pad 12 low substantially to 0V in response to a 2.5V level on pull-down control terminal AN. When the enable signal on enable terminal EN is high or the enable signal on enable terminal TN is low, the pull-up control signal on terminal AP will be 3.3V and the pull-down control signal on terminal AN will be 0V causing I/O stage 24 to operate in a tri-state or high impedance mode in which the buffer appears transparent to I/O pad 12. When in the tri-state mode, I/O stage 24 applies data signals received on I/O pad 12 to core terminal Z for processing by the integrated circuit on which I/O buffer 10 is fabricated.

Tri-state control circuit 14 also generates complementary 0V–2.5V tri-state control signals on terminals OFF and OFFB, which are provided to tri-state control voltage shifting circuit 20. Terminal OFF is also coupled to feedback circuit 22. Circuit 20 receives the complementary 0V–2.5V tri-state control signals on terminals OFF and OFFB and generates complementary 0.8V–3.3V tri-state control signals on terminals S1 and S2. Terminals S1 and S2 are coupled to feedback circuit 22 for controlling various PMOS pull-up devices within feedback circuit 22 and are level shifted to provide protection against high feedback voltages experienced within feedback circuit 22.

During the tri-state mode, feedback circuit 22 senses the voltage level on I/O pad 12 through terminal Z1 and adjusts the voltage on pull-up control terminal AP if the sensed voltage level exceeds a selected threshold, such as 3.3V, to prevent leakage current through the pull-up devices in I/O stage 24. When feedback circuit 22 senses that the voltage on I/O pad 12 exceeds the threshold voltage, feedback circuit 22 adjusts the bias levels on control terminals APB and J1 such that pull-up control circuit 18 floats terminal AP to an undetermined voltage. In one embodiment, feedback circuit 22 passes the high voltage sensed on I/O terminal 12 to pull-up control terminal AP which ensures that the pull-up devices within I/O stage 24 remain off in the tri-state mode, thereby preventing leakage through the pull-up devices. When the sensed voltage level on I/O pad 12 is less than the threshold level, feedback circuit 22 is essentially decoupled from pull-up control terminal AP.

Feedback circuit 22 also adjusts the bias level of the pull-up device substrates in I/O stage 24 through substrate bias terminal WELL. When feedback circuit 22 senses that the voltage level on I/O pad 12 is less than the threshold voltage, feedback circuit 22 sets the bias level on terminal WELL to a selected voltage, such as 3.3V. When feedback circuit 22 senses that the voltage level on I/O pad 12 exceeds the threshold voltage, feedback circuit 22 floats substrate bias terminal WELL to an undetermined voltage. This allows the substrates of the pull-up devices to rise with the voltage on I/O pad 12, as described in greater detail with reference to FIG. 4.

FIG. 2 is a logic diagram of tri-state control circuit 14. Tri-state control circuit 14 includes NOR gates 30 and 32, inverters 34 and 36 and NAND gate 38. NOR gate 30 has an active low input coupled to enable terminal EN and an active high input coupled to enable terminal TN. The output of NOR gate 30 defines tri-state control terminal OFF and is coupled to the input of inverter 34 and one of the inputs of NAND gate 38. The output of inverter 34 defines tri-state control terminal OFFB and is coupled to one of the inputs of NOR gate 32. The output NOR gate 32 is coupled to terminal APA. Data terminal A is coupled to the input of inverter 36. The output of inverter 36 is coupled to one of the inputs of NOR gate 32 and one of the inputs of AND gate 38. The output of NAND gate 38 is coupled to terminal ANA. Tri-state control terminals OFF and OFFB are provided to tri-state control voltage shifting circuit 20 and feedback circuit 22, as shown in FIG. 1.

During normal operation, the enable signal applied to enable terminal EN is low and the enable signal applied to enable terminal TN is high. Tri-state control terminals OFF and OFFB are high and low, respectively, and the data signals applied to data terminal A pass to terminals APA and ANA. When either enable terminal EN is high or enable TN is low, tri-state control terminals OFF and OFFB are low and high, respectively. NOR gate 32 drives terminal APA to a logic low state and NAND gate 38 drives terminal ANA to a logic high state.

FIG. 3 is a schematic diagram of pull-down control circuit 16 and pull-up control circuit 18. Pull-down control circuit 16 includes inverters 40, 42, 44, 46 and 48 which are coupled together in series between terminal ANA and pull-down control terminal AN. Inverter 48 includes three transistors, N-channel transistor MN1 and P-channel transistors MP1 and MP2, to allow bypassing of the delay line formed by inverters 40, 42, 44 and 46 during a low-to-high transition on terminal ANA. A high-to-low transition must pass through the delay line before pulling terminal AN high through transistors MP1 and MP2. This prevents I/O stage 24 (shown in FIG. 1) from pulling I/O pad 12 low and high at the same time, as discussed in greater detail below. Inverters 40, 42, 44, 46 and 48 are biased between voltage supply terminals VDD and VSS. Voltage supply terminals VDD and VSS are coupled to an external power supply (not shown) which provides a 2.5V core supply voltage. The pull-down control signals generated on terminal AN therefore have a voltage swing of about 0V–2.5V.

Pull-up control circuit 18 is a voltage level shifting differential amplifier and includes bias circuit 50, inverter 52, N-channel differential transistor pair MN2 and MN3, N-channel voltage protection transistors MN4 and MN5, P-channel pass gate transistors MP3 and MP4, P-channel cross-coupled transistor pair MP5 and MP6, P-channel charge boosting transistors MP7 and MP8 and P-channel pull-up transistor MP9. Bias circuit 50 generates a bias voltage of about 0.8V on voltage bias node VBIAS 10. Bias circuit 50 can include any suitable bias generator, such as a resistor tree, a biased current source, a self-fed inverter or a voltage regulator. An example of a suitable bias generator is disclosed in U.S. Ser. No. 08/906,357, filed Aug. 5, 1997 and entitled "OUTPUT BUFFER WITH REGULATED VOLTAGE BIASING FOR DRIVING VOLTAGES GREATER THAN TRANSISTOR TOLERANCE," which is assigned to the same assignee as the present application and is hereby incorporated by reference.

The pull-up control signals received on terminal APA are applied directly to the gate of transistor of MN2 and are applied to the gate of transistor MN3, at terminal APAB, through inverter 52. Inverter 52 includes N-channel transistor MN6 and P-channel transistor MP10 which are coupled together in series between voltage supply terminal VDD and voltage supply terminal VSS. The gates of transistors MN2 and MN3 therefore receive complementary 0V–2.5V pull-up control signals on terminals APA and APAB.

The sources of transistors MN2 and MN3 are coupled to voltage bias node VBIAS10, and the drains of transistors MN2 and MN3 define first and second current paths I1 and I2 through nodes N1 and N2, respectively. Voltage protection transistor MN4 is coupled in series between pull-up control terminal AP and node N1. Voltage protection transistor MN5 is coupled in series between nodes N2 and N3. The gates of transistors MN4 and MN5 are coupled to voltage supply terminal VDD. Pass gate transistor MP3 has a gate coupled to control terminal J1, a drain coupled to pull-up control terminal AP and a source coupled to the drain of transistor MP5. Transistor MP4 has a gate coupled to control terminal APB, a drain coupled to node N3 and a source coupled to node N4 and the drain of transistor MP6. Transistors MP5 and MP6 are cross coupled with one another through pass gate transistors MP3 and MP4. Transistor MP5 has a gate coupled to node N3, a drain coupled to the source of pass gate transistor MP3 and a source coupled to voltage supply terminal VDDIO33. Transistor MP6 has a gate coupled to pull-up control terminal AP, a drain coupled to node N4 and a source coupled to voltage supply terminal VDDIO33. Voltage supply terminal VDDIO33 is coupled to an external power supply (not shown) which provides a 3.3V I/O supply voltage on voltage supply terminal VDDIO33.

Charge boosting transistor MP7 is a pull-up transistor which is coupled between voltage supply terminal VDD and node N1 and is controlled by terminal APA. Charge boosting transistor MP8 is a pull-up transistor which is coupled between voltage supply terminal VDD and node N2 and is controlled by terminal APAB. Transistor MP9 is a pull-up transistor which is coupled between voltage supply terminal VDD and node N4 and is controlled by tri-state control terminal S2.

The substrates of transistors MN2–MN6 are coupled to voltage supply terminal VSS. The substrate of transistor MP3 is coupled to substrate bias terminal WELL. The substrates of transistors MP4–MP6 and MP9 are coupled to voltage supply terminal VDDIO33. The substrates of transistors MP7, MP8 and MP10 are coupled to voltage supply terminal VDD.

In drive mode, feedback circuit 22 (shown in FIG. 1) biases control terminals J1 and APB at the voltage level on voltage bias node VBIAS10. Pass gate transistors MP5 and MP4 are therefore on and couple the drains of transistors MN4 and MN5 to the drains of transistors MP5 and MP6, respectively. Pull-up control circuit 18 receives the 0V–2.5V pull-up control signal on terminal APA and generates the inverted and level shifted 3.3V–0.8V pull-up control signal on pull-up control terminal AP.

If the pull-up control signal terminal APA is high, transistor MN2 will be on and transistor MN3 will be off. Transistor MN2 pulls current through current path I1 which discharges node N1 and terminal AP toward the voltage level on voltage bias node VBIAS10, which is at about 0.8V. The voltage level on bias node VBIAS10 prevents node AP from discharging below 0.8V, which prevents an over voltage condition on transistors MP5 and MP6 that would otherwise occur with the drains of these transistors being tied to 3.3V.

The low voltage on terminal AP turns on transistor MP6 which charges nodes N2–N4 toward 3.3V. Charge boosting transistor MP8 assists transistor MP6 in charging node N2 when the voltage on terminal APA is high. The high voltage on node N3 turns off transistor MP5. As node N2 reaches about 2.0V, transistor MN5 turns off since its gate is tied to 2.5V and thereafter prevents further charging of node N2. This prevents node N2 from reaching 3.3V and an over voltage condition with respect to the gate of transistor MN3, which is at 0V.

When the pull-up control signal on terminal APA goes low, transistor MN2 turns off and transistor MN3 turns on. Transistor MN3 discharges nodes N2–N4 toward 0.8V. The low voltage at node N3 turns on transistor MP5, which charges node N1 and terminal AP toward 3.3V and turns off transistor MP6. Charge boosting transistor MP7 assists transistor MP5 in charging node N1 when the voltage on terminal APA is low. As node N1 reaches about 2.0V, transistor MN4 turns off since its gate is tied to 2.5V. This prevents further charging of node N1 and thereby protects transistor MN2 from an over voltage condition. Pull-up control circuit 18 therefore receives 0V–2.5V pull-up control signals on terminal APA and, in response, generates inverted and level shifted 3.3V–0.8V pull-up control signals on terminal AP.

In the tri-state mode, when the voltage on I/O pad 12 (shown in FIG. 1) exceeds the threshold voltage, feedback circuit 22 increases the voltages on control terminals J1 and APB, which turn off pass gate transistors MP3 and MP4. Since terminal APA is low in the tri-state mode, transistor MN2 is also off which results in terminal AP floating to an undetermined voltage. This allows feedback circuit 22 to drive terminal AP up to 5V as a function of the voltage on I/O pad 12. Pass gate transistor MP4 decouples node N4 from voltage bias terminal VBIAS10 which prevents an over voltage condition with respect to the gate of transistor MP6, which is now at about 5V. In the tri-state mode, tri-state control terminal S2 is at 0.8V, which turns on pull-up transistor MP9 to define node N4 at a safe 2.5V level with respect to the gate of transistor MP6.

FIG. 4 is a schematic diagram of I/O stage 24. I/O stage 24 includes input stage 60, output stage 62, unused output stage 64, polysilicon resistor R1, electrostatic discharge (ESD) protection resistor R2 and clamping diode D1. Input stage 60 includes N-channel input transistor MN7 which has a gate coupled to voltage supply terminal VDD, a source coupled to core terminal Z, a drain coupled to resistor R1 and a substrate coupled to voltage supply terminal VSSIO, which is a ground terminal for voltage supply terminal VDDIO33. Resistor R1 is coupled between the drain of transistor MN7 and I/O terminal Z1. Resistor R2 is coupled between I/O terminal Z1 and I/O pad 12. Clamping diode D1 has an anode coupled to I/O terminal Z1 and a cathode coupled to voltage supply terminal VDDIO50. Voltage supply terminal VDDIO50 is coupled to an external voltage supply (not shown) which provides a 5V supply voltage on voltage supply terminal VDDIO50.

In the tri-state mode, data signals received on I/O pad 12 are transmitted through input transistor MN7 to core terminal Z. For a 5V peripheral component interface (PCI) application, I/O stage 24 must be capable of tolerating a steady 5V data signal on I/O pad 12 and voltage spikes of up to 11V. Since the cathode of clamping diode of D1 is tied to about 5V, clamping diode D1 clamps voltage spikes on I/O terminal 12 to about 5.5V which protects the semiconductor devices within I/O stage 24 from voltages above 5.5V.

Output driver stage 62 includes N-channel pull-down transistor MN8, N-channel voltage protection transistor MN9, P-channel voltage protection transistor MP11 and P-channel pull-up transistor MP12. Pull-down transistor MN8 has a gate coupled to pull-up control terminal AN, a source coupled to voltage supply terminal VSSIO and a drain coupled to node N5. Voltage protection transistor MN9 has a gate coupled to voltage supply terminal VDD, a source coupled to node N5 and a drain coupled to I/O terminal Z1. Voltage protection transistor MP11 has a gate coupled to control terminal APB, a source coupled to node N6 and a drain coupled to I/O terminal Z1. Pull-up transistor MP12 has a gate coupled to terminal AP, a source coupled to voltage supply terminal VDDIO33 and a drain coupled to node N6.

Several output driver stages are often coupled together in parallel to provide extra drive strength through I/O pad 12 and to provide ESD protection. In this embodiment, parallel output driver stage 64 is unused. Output driver stage 64 includes N-channel pull-down transistor MN10, N-channel voltage protection transistor MN11, P-channel voltage protection transistor MP13 and P-channel pull-up transistor MP14. The transistors in output driver stage 64 are coupled together in a similar manner as the transistors in output driver stage 62, but the gate of transistors MN10 and MP14 are coupled to voltage supply terminal VSSIO and substrate bias terminal WELL, respectively. The substrates of N-channel transistors MN8–MN11 are coupled to voltage supply terminal VSSIO. The substrates of P-channel transistors MP11–MP14 are coupled to substrate bias terminal WELL.

In the drive mode, substrate bias terminal WELL is driven to about 3.3V and control terminal APB is driven to about 0.8V by feedback circuit 22 (shown in FIG. 1). The high voltage on terminal WELL turns off transistor MP14 in unused output driver 64. The pull-down and pull-up control signals on terminals AN and AP pull I/O pad 12 down substantially to 0V or up substantially to 3.3V through output driver stage 62, depending on the logic state of the data signals received on data terminal A (shown in FIGS. 1–3). Pull-down transistor MN8 is driven with a voltage level of 0V–2.5V while pull-up transistor MP12 is driven with a shifted voltage level of 0.8V–3.3V. This protects pull-down transistor MN8 and pull-up transistor MP12 from gate-to-source, gate-to-drain and gate-to-bulk voltage drop of greater than 3.0V.

When terminal AP is low at 0.8V, pull-up transistor MP12 turns on and charges node N6, I/O terminal Z1 and node N5 toward 3.3V. Terminal AN is high at 2.5V, which turns off pull-down transistor MN8. As node N5 reaches about 2.0V, voltage protection transistor MN9 turns off since its gate is tied to 2.5V. This prevents further charging of node N5, which protects pull-down transistor MN8 from an over voltage condition. Since control terminal APB is at 0.8V in the drive mode, the gate-to-source, gate-to-drain and gate-to-bulk voltages of transistor MP11 are kept to less than the transistor tolerance of 3.0V when node N6 and I/O pad 12 are charged to 3.3V.

When pull-up control terminal AP goes high to 3.3V, pull-up transistor MP12 turns off. The delay line formed by inverters 40, 42, 44, 46 and 48 (shown in FIG. 3) prevent pull-down control terminal AN from going high until pull-up transistor MP12 has turned off. This prevents transistors MP12 and MN8 from being on at the same time. Pull-down transistor MN8 turns on and discharges node N5, I/O terminal Z1 and node N6 toward 0V. As node N6 drops below the voltage on the gate of voltage protection transistor MP11, transistor MP11 turns off preventing further discharge of node N4 and an over voltage condition on pull-up transistor MP12.

In the tri-state mode, pull-down control circuit 16 (shown in FIG. 3) drives terminal AN to 0V and pull-up control circuit 18 (also shown in FIG. 3) drives terminal AP to 3.3V. Transistors MN8 and MP12 turn off, which isolates I/O terminal Z1 and I/O pad 12 from voltage supply terminals VDDIO33 and VSSIO. Feedback circuit 22 increases the voltage on control terminal APB from about 0.8V to about 2.5V, which protects transistor MP11 from gate-to-source voltage drops of greater than 3.0V when the data on I/O terminal Z1 is greater than 3.3V.

When the voltage on I/O terminal Z1 exceeds 3.3V, such as when receiving 5V data signals, feedback circuit 22 passes the high voltage on I/O terminal Z1 to pull-up control terminal AP. This ensures that the voltage on terminal AP is high enough that pull-up transistor MP12 remains off when high voltages are applied to I/O terminal Z1 and thereby prevents leakage current from flowing through transistor MP12 to voltage supply terminal VDDIO33. Also, a 5V level on I/O terminal Z1 pulls substrate bias terminal WELL up to about 4.3V through a diode formed by the NP junction from the drains of transistors MP11 and MP13 to the substrates of transistors MP11 and MP13. The increased voltage on substrate bias terminal WELL limits the gate-to-bulk voltage on pull-up transistor MP12 and ensures that unused pull-up transistor MP14 remains off to prevent any leakage current from flowing through transistor MP14. When the voltage on I/O terminal Z1 is less than 3.3V, feedback circuit 22 biases substrate bias terminal WELL at about 3.3V.

FIG. 5 is a schematic diagram of tri-state control voltage shifting circuit 20. Circuit 20 receives complementary 0V–2.5V tri-state control signals on terminals OFF and OFFB and generates complementary 3.3V–0.8V tri-state control signals on terminals S1 and S2, respectively, which are used for biasing various pull-up devices within feedback circuit 22 (shown in FIG. 1). Circuit 20 is a voltage level shifting differential amplifier which includes differential transistor pair MNS3 and MNS4, N-channel voltage protection transistors MNS1 and MNS2, P-channel voltage protection transistors MPS1 and MPS2 and P-channel charge boosting transistors MPS3 and MPS4. Circuit 20 is biased between voltage supply terminal VDDIO33 and voltage bias terminal VBIAS10. The transistors in circuit 20 are coupled together and operate in the same manner as the corresponding transistors in pull-up control circuit 18 (shown in FIG. 3).

FIG. 6 is a schematic diagram of feedback circuit 22. Feedback circuit 22 includes drive mode bias circuit 70, low feedback circuit 72, high feedback circuit 74, pass gate bias circuit 76, pass gate bias circuit 78, APB bias circuit 80 and substrate bias circuit 82. Drive mode bias circuit 70 is coupled between voltage bias terminal VBIAS10 and control terminal J1. Drive mode bias circuit 70 includes N-channel bias transistor MN15 and N-channel voltage protection transistor MN16 for selectively pulling control terminal J1 to the voltage level on voltage bias terminal VBIAS10 in the drive mode, when the tri-state control signal on terminal OFF is at 2.5V.

Low feedback path 72 includes N-channel voltage protection transistor MN17, N-channel pull-down transistor MNN18, P-channel pull-up transistors MP15 and MP16, N-channel bias transistor MN19 and N-channel voltage protection transistor MN20. Low feedback circuit 72 is coupled between I/O terminal Z1 and control terminal J1 for selectively pulling control terminal J1 to the voltage level on voltage bias terminal VBIAS10 in the tri-state mode when the voltage on I/O terminal Z1 is less than the threshold voltage. High feedback circuit 74 includes P-channel voltage protection transistor MP17, P-channel pass gate transistor MP18 and P-channel pass gate transistor MP19. Voltage protection transistor MP17 and pass gate transistor MP18 are coupled together in series between I/O terminal Z1 and control terminal J1. Pass gate transistor MP19 is coupled in series between control terminal J1 and pull-up control terminal AP. High feedback circuit 74 selectively feeds the voltage on I/O terminal Z1 back to control terminal AP when the buffer is in the tri-state mode and the voltage on I/O terminal Z1 exceeds the threshold level.

Pass gate bias circuit 76 includes P-channel transistors MP20 and MP21. Transistor MP20 is coupled in series between voltage supply terminal VDDIO33 and the gate of pass gate transistor MP18. The gate of transistor MP20 is coupled to tri-state control terminal S1. Transistor MP21 is coupled in series between voltage supply terminal VDD and the gate of pass gate transistor MP1. The gate of transistor MP21 is coupled to tri-state control terminal S2. Pass gate bias circuit 78 includes P-channel pull-up transistors MP22, MP23 and MP24. Pull-up transistor MP22 is coupled in series between voltage supply terminal VDDIO33 and the gate of pass gate transistor MP19. The gate of pull-up transistor MP22 is coupled to tri-state control terminal S1. Pull-up transistors MP23 and MP24 are coupled together in series between voltage supply terminal VDDIO33 and the gate of pass gate transistor MP19. The gate of pull-up transistor MP23 is coupled to tri-state control terminal S2, and the gate of pull-up transistor MP24 is coupled to the drain of pull-up transistor MP24 to form a diode.

APB bias circuit 80 includes N-channel transistor MN21 and P-channel transistor MP25. Transistor MN21 is coupled in series between voltage bias terminal VBIAS10 and control terminal APB. The gate of transistor MN21 is coupled to tri-state control terminal OFF. Transistor MP25 is coupled in series between voltage supply terminal VDD and control terminal APB. The gate of transistor MP25 is coupled to tri-state control terminal OFF. APB bias circuit 80 sets the voltage on control terminal APB to 0.8V when OFF is at 2.5V in the drive mode and to 2.5V when OFF is at 0V in the tri-state mode. Substrate bias circuit 82 includes P-channel pull-up transistors MP26 and MP27 which are coupled together in parallel between voltage supply terminal VDDIO33 and substrate bias terminal WELL. The gates of transistors MP26 and MP27 are coupled to control terminal J1. Substrate bias circuit 82 sets the voltage on substrate bias terminal WELL at 3.3V when control terminal J1 is below 3.3V and floats substrate bias terminal WELL to an undetermined voltage when control terminal J1 is above 3.3V.

The substrates of transistors MN15–MN21 are coupled to voltage supply terminal VSS. The substrates of transistors MP15, MP16, and MP25 are coupled to voltage supply terminal VDD. The substrates of transistors MP17–MP19, MP26 and MP27 are coupled to substrate bias terminal WELL. The substrates of transistors MP20–MP24 are coupled to voltage supply terminal VDDIO33.

During operation when the buffer is in the drive mode, tri-state control terminal OFF is at 2.5V, tri-state control terminal S1 is at 0.8V and tri-state control terminal S2 is at 3.3V. Bias transistor MN15 turns on and pulls bias terminal J1 low to the voltage level on voltage bias terminal VBIAS10, which is at 0.8V. The low voltage on control terminal J1 turns on substrate bias transistors MP26 and MP27 which pull substrate bias terminal WELL to 3.3V. Referring to FIG. 4, with substrate bias terminal WELL at 3.3V, pull-up transistor MP14 in unused output driver stage 64 is off and the substrates of transistors MP11 and MP12 in output driver stage 62 are biased to drive I/O pad 12 selectively to 3.3V.

Referring back to FIG. 6, the 0.8V level on terminal S1 turns on transistor MP20 of pass gate bias circuit 76, and the 3.3V level on terminal S2 turns off transistor MP21. Transistor MP20 charges the gate of pass gate transistor MP18 to 3.3V, which turns off pass gate transistor MP18 and thereby decouples I/O terminal Z1 from bias terminal J1 within high feedback circuit 74. In pass gate bias circuit 78, the 0.8V level on terminal S1 turns on pull-up transistor MP22 which charges the gate of pass gate transistor MP19 to 3.3V, turning off transistor MP19 and thereby decoupling pull-up control terminal AP from bias terminal J1. The 3.3 level on terminal S2 turns off pull-up transistor MP23.

In APB bias circuit 80, the 2.5V level on terminal OFF turns on transistor MN21 and turns off transistor MP25. Transistor MN21 pulls control terminal APB to the voltage level on voltage bias terminal VBIAS10, which is at about 0.8V.

Referring to FIG. 3, with control terminals J1 and APB at 0.8V, pass gate transistors MP3 and MP4 are on and pull-up control circuit 18 functions normally to generate inverted and level shifted pull-up control signals on pull-up control terminal AP in response to data signals received on terminal APA.

Referring back to FIG. 6, when the buffer is in the tri-state mode, terminal OFF is at 0V, terminal S1 is at 3.3V and terminal S2 is at 0.8V. The low voltage on terminal OFF turns off transistor MN15 bias circuit 70. If the voltage on I/O terminal Z1 is less than the threshold voltage of 2.5V, low feedback circuit 72 is enabled and high feedback circuit 74 is disabled. The low voltage on I/O terminal Z1 is passed through voltage protection transistor MN17 and discharges the gates of pull-up transistor MP15 and pull-down transistor MN18. Pull-up transistors MP15 and MP16 pull the gate of bias transistor MN19 high toward 2.5V. Bias transistor MN19 turns on and pulls control terminal J1 toward the voltage level on voltage bias terminal VBIAS10, which is about 0.8V. With control terminal J1 at 0.8V, substrate bias transistors MP26 and MP27 remain on and continue to pull substrate bias terminal WELL to 3.3V.

With terminal OFF at 0V, transistor MP25 in APB bias circuit 80 pulls APB control terminal to 2.5V. Referring to FIG. 3, with control terminal J1 at 0.8V and control terminal APB at 2.5V, pass gate transistor MP3 remains on such that pull-up control circuit 18 operates in a normal tri-state mode in which the circuit pulls pull-up control terminal AP high to about 3.3V. Pass gate transistor MP4 is turned off.

Referring back to FIG. 6, the 3.3V level on terminal S1 turns off transistor MP20 in pass gate bias circuit 76, and the 0.8V level on terminal S2 turns on transistor MP21. Transistor MP21 pulls the gate of pass gate transistor MP18 to voltage on voltage supply terminal VDD, which is at 2.5V. With the gates of pass gate transistor MP18 and voltage protection transistor MP17 at 2.5V and with the voltage on I/O terminal Z1 low (less than 2.0V), transistors MP17 and MP18 are off which isolates control terminal J1 from I/O terminal Z1 in high feedback circuit 74. In pass gate bias circuit 78, pull-up transistor MP22 is off and pull-up transistor MP23 is on. Transistor MP23 and transistor MP24 charge the gate of pass gate transistor MP19 to a PMOS turn-on threshold voltage $V_{P,TH}$ below voltage supply terminal VDDIO33, or about 2.8V. This ensures that pass gate transistor MP19 does not turn on until its source at control terminal J1 reaches at least a PMOS threshold voltage above 2.8V. This sets the threshold voltage at which pass gate transistor MP19 turns on at about 3.3V.

When the voltage on I/O terminal Z1 exceeds the threshold voltage of 2.5V, such as when receiving a 5V data signal from I/O pad 12, low feedback circuit 72 is disabled and high feedback circuit 74 is enabled. The high voltage on I/O terminal Z1 charges the gate of pull-down transistor MN18 until it reaches an NMOS threshold voltage below the gate of voltage protection transistor MN17, which is at 2.5V. Thereafter, voltage protection transistor MN17 turns off which protects transistor MN18 from over voltage condition since its source is at 0V. Transistor MP15 turns off and transistor MN18 turns on, which discharges the gate of bias transistor MN19. Bias transistor MN19 turns off and isolates bias terminal J1 from voltage bias terminal VBIAS10.

With the voltage on I/O terminal Z1 exceeding 2.5V and the gates of voltage protection transistor MP17 and pass gate transistor MP18 at 2.5V, transistors MP17 and MP18 turn on and feed the voltage on I/O terminal Z1 to control terminal J1. The high voltage on control terminal Z1 turns off substrate bias transistors MP26 and MP27 allowing substrate bias terminal WELL to float to an undetermined voltage. Substrate bias terminal WELL can then be driven high through the drain-to-substrate NP of transistors MP11 and MP13.

Referring to FIG. 3, the high voltage on terminal J1 turns off pass gate transistor MP3 which allows pull-up control terminal AP to float to an undetermined voltage and be driven by high feedback circuit 74. Referring back to FIG. 6, when control terminal J1 reaches 3.3V, pass gate transistor MP19 turns on which passes the high voltage on bias terminal J1 to pull-up control terminal AP and ensures that pull-up transistor MP12 (shown in FIG. 4) remains off so there is no leakage current through pull-up transistor MP12.

Since the transistors in feedback circuit 22 are fabricated in a 2.5V process, the high 5V level on I/O terminal Z1 and control terminal J1 requires the addition of several voltage protection transistors along each leg of feedback circuit 22 to prevent over voltage conditions. For example, when the voltage on bias terminal J1 exceeds 2.0V, voltage protection transistors MN16 and MN20 turn off since their gates are tied to 2.5V. This isolates transistors MN15 and MN19 from the high 5V signal which prevents voltage drops across the transistors that would exceed their tolerance. Likewise, transistor MN17 protects pull-down transistor MN18 from an over voltage condition when I/O terminal Z1 is high. Transistor MP17 protects pass gate transistor MP18 when the gate of transistor MP18 is at 3.3V and I/O terminal Z1 is at 0V.

In one alternative embodiment, transistors MP22–MP24 in pass gate bias circuit 78 are removed and the gate of pass gate transistor MP19 is coupled directly to voltage supply terminal VDDIO33. This increases the threshold voltage at which pass gate MP19 turns on to a PMOS threshold voltage above VDDIO33.

The tri-state output driver of the present invention is tolerant to a steady 5V input signal and drives a 3.3V output signal on I/O pad 12 while the semiconductor devices within the driver are tolerant only to 3V from gate-to-source, gate-to-drain or gate-to-bulk and 2.75V from source-to-drain. The tri-state output driver of the present invention is also capable of accepting voltage spikes of up to 11V. As a result, the tri-state output buffer of the present invention can be used on a 2.5V integrated circuit to interface with a 5V PCI buffer. The gate lengths of any transistors with risky drain-to-source voltages can be elongated for additional tolerance.

Although the present invention has been described with reference to preferred embodiments, workers skilled in the art will recognize that changes may be made in form and detail without departing from the spirit and scope of the invention. For example, the present invention can be implemented with various technologies, including CMOS, and can have a variety of circuit configurations. The transistors shown in the figures can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. A tri-state buffer for use in an integrated circuit, the tri-state buffer comprising:

a core terminal for receiving a data signal;

a pad terminal;

an enable terminal for receiving an enable signal having an active state and an inactive state;

a pad pull-down transistor and a pad pull-up transistor which are coupled to the pad terminal and have pull-up and pull-down control terminals, respectively;

a pull-down control circuit coupled between the core terminal and the pull-down control terminal;

a pull-up control circuit coupled between the core terminal and the pull-up control terminal; and feedback means coupled between the pad terminal and the pull-up control terminal for sensing a first voltage on the pad terminal and for adjusting a second voltage on the pull-up control terminal based on the sensed first voltage to reduce leakage current through the pad pull-up transistor when the enable signal is in the inactive state, the feedback means comprising pass gate means for passing the sensed first voltage from the pad terminal to the pull-up control terminal when the sensed first voltage exceeds a threshold level.

2. The tri-state buffer of claim 1 wherein the pass gate means comprises:

a first pass gate transistor which is coupled between the pad terminal and a feedback bias node and which has a control terminal;

first pass gate bias means for applying a first pass gate bias voltage to the control terminal of the first pass gate as a function of the enable signal;

a second pass gate transistor which is coupled between the feedback bias node and the pull-up control terminal;

second pass gate bias means for applying a second pass gate bias voltage to the control terminal of the second pass gate.

3. The tri-state buffer of claim 2 wherein the second pass gate transistor comprises a P-channel transistor having a turn-on voltage characteristic $V_{P,TH}$ and wherein the second pass gate bias means sets the second pass gate bias voltage at the threshold level minus the turn-on voltage characteristic $V_{P,TH}$.

4. The tri-state buffer of claim 1 and further comprising:

a substrate bias node;

wherein the pad pull-up transistor comprises a substrate terminal which is coupled to the substrate bias node; and wherein the feedback means comprises means for (1) biasing the substrate bias node at a substrate bias voltage when the enable signal is in the active state and when the enable signal is in the inactive state and the sensed first voltage on the pad terminal is less than a threshold level; and (2) floating the substrate bias node to an undefined voltage when the enable signal is in the inactive state and the sensed first voltage on the pad terminal exceeds the threshold level.

5. The tri-state buffer of claim 4 wherein the feedback means comprises:

a P-channel substrate pull-up transistor which is coupled to the substrate bias node and has a control terminal;

a high feedback path comprising pass gate means for passing the first voltage from the pad terminal to the control terminal of the P-channel substrate pull-up transistor so as to bias the P-channel substrate pull-up transistor in an off state only when the enable signal is in the inactive state and the first voltage on the pad terminal exceeds the threshold level; and a low feedback path comprising bias means for biasing the P-channel substrate pull-up transistor in an on state when (1) the enable signal is in the active state and (2) the enable signal is in the inactive state and the first voltage on the pad terminal is less than the threshold level.

6. The tri-state buffer of claim 4 and further comprising:

a pull-up voltage protection transistor coupled between the pad pull-up transistor and the pad terminal and having a control terminal and a substrate terminal, wherein the substrate terminal is coupled to the substrate bias node; and a voltage protection bias circuit coupled to the control terminal of the pull-up voltage protection transistor.

7. The tri-state buffer of claim 6 wherein the voltage protection bias circuit is coupled to the enable terminal and comprises means for biasing the control terminal of the pull-up voltage protection transistor at a first protection bias voltage when the enable signal is in the active state and at a second protection bias voltage, which is greater than the first protection bias voltage, when the enable signal is in the inactive state.

8. The tri-state buffer of claim 1 wherein the pull-down control circuit comprises an inverter circuit coupled between the core terminal and the pull-down control terminal.

9. The tri-state buffer of claim 1 wherein the pull-up control circuit comprises a voltage level shifting differential amplifier.

10. The tri-state buffer of claim 9 and further comprising:

a core supply terminal and a core ground terminal for supplying a core supply voltage;

an input-output (I/O) supply terminal and an I/O ground terminal for supplying an I/O supply voltage which is greater than the core supply voltage;

a bias terminal; and wherein the differential amplifier comprises:

an inverter having an input coupled to receive the data signal from the core terminal and having an output;

a differential transistor pair coupled to the bias terminal and defining first and second current paths, the differential transistor pair having a first control terminal coupled to receive the data signal from the core terminal and having a second control terminal coupled to the output of the inverter; and a cross coupled transistor pair coupled in the first and second current paths between the first I/O supply terminal and the differential transistor pair and having a pull-up control output which is coupled to the pull-up control terminal of the pad pull-up transistor.

11. The tri-state buffer of claim 10 wherein the differential amplifier further comprises:

first and second voltage protection transistors coupled in the first and second current paths, respectively, between the differential transistor pair and the cross coupled transistor pair and having control terminals coupled to the core supply terminal.

12. The tri-state buffer of claim 10 wherein the differential amplifier comprises decoupling means for decoupling the pull-up control output from the pull-up control terminal of the pad pull-up transistor when the enable signal is in the active state and the sensed first voltage on the pad terminal exceeds a threshold level.

13. The tri-state buffer of claim 12 wherein:

the decoupling means comprises:

a first pass gate transistor coupled in one of the first and second current paths, between the cross coupled transistor pair and the pull-up control output, and having a control terminal; and first pass gate control means for biasing the first pass gate in an on state when the enable signal is in the active state; and the feedback means comprises:

a second pass gate transistor coupled between the pad terminal and the control terminal of the first pass gate transistor and having a control terminal; and second pass gate control means coupled to the control terminal of the second pass gate transistor for biasing the second pass gate transistor in an on state only when the enable signal is in the inactive state and the first voltage on the pad terminal exceeds the threshold level, wherein the second pass gate transistor when in the on state passes the first voltage from the pad terminal to the control terminal of the first pass gate transistor which biases the first pass gate transistor in an off state.

14. The tri-state buffer of claim 1 and further comprising:

a pull-down voltage protection transistor coupled between the pad terminal and the pull-down transistor.

15. A method of operating a tri-state buffer in an integrated circuit having a core terminal and a pad terminal, wherein the tri-state buffer is operable in a drive mode and a high impedance mode and comprises a pad pull-up transistor which is coupled in series between an I/O supply terminal and the pad terminal and has a control terminal, the method comprising:

biasing the control terminal of the pad pull-up transistor to switch the transistor between on and off states as a function of a logic state of data signals received on the core terminal when the tri-state buffer is in the drive mode;

biasing the control terminal of the pad pull-up transistor to operate the transistor in the off state when the tri-state buffer is in the high impedance mode;

sensing a voltage level on the pad terminal when the tri-state buffer is in the high impedance mode, wherein the step of sensing comprises sensing whether the voltage level on the pad terminal exceeds a threshold level; and adjusting the biasing of the control terminal of the pad pull-up transistor as a function of the voltage level sensed on the pad terminal to maintain the pad pull-up transistor in the off state when the tri-state buffer is in the high impedance mode to thereby prevent leakage current from the I/O supply terminal to the pad terminal, wherein the step of adjusting comprises feeding the voltage level sensed on the pad terminal to the control terminal of the pad pull-up transistor when the voltage level exceeds the threshold level.

16. The method of claim 15 wherein the tri-state buffer further comprises a voltage protection transistor coupled between the pad pull-up transistor and the pad terminal, the pad pull-up transistor and the voltage protection transistor each having a substrate terminal, and wherein the method further comprises:

coupling the substrate terminals to a substrate bias node;

biasing the substrate bias node at a bias voltage when (1) the tri-state output buffer is in the drive mode or (2) the tri-state buffer is in the high impedance mode and the voltage level sensed on the pad terminal is less than a threshold level; and floating the substrate bias node at an undetermined voltage when the tri-state buffer is in the high impedance mode and the voltage level sensed on the pad terminal exceeds the threshold level.

17. A tri-state buffer for use in an integrated circuit, the tri-state buffer comprising:

a core terminal for receiving a data signal;

a pad terminal;

an enable terminal for receiving an enable signal having an active state and an inactive state;

a substrate bias node;

a pad pull-down transistor and a pad pull-up transistor which are coupled to the pad terminal and have pull-up and pull-down control terminals, respectively, wherein the pad pull-up transistor comprises a substrate terminal which is coupled to the substrate bias node;

a pull-down control circuit coupled between the core terminal and the pull-down control terminal;

a pull-up control circuit coupled between the core terminal and the pull-up control terminal; and feedback means coupled between the pad terminal and the pull-up control terminal for sensing a first voltage on the pad terminal and for adjusting a second voltage on the pull-up control terminal based on the sensed first voltage to reduce leakage current through the pad pull-up transistor when the enable signal is in the inactive state, wherein the feedback means biases the substrate bias node at a substrate bias voltage when the enable signal is in the active state and when the enable signal is in the inactive state and the sensed first voltage on the pad terminal is less than a threshold level, and wherein the feedback means floats the substrate bias node to an undefined voltage when the enable signal is in the inactive state and the sensed first voltage on the pad terminal exceeds the threshold level.

* * * * *